(12) United States Patent
Mudulodu et al.

(10) Patent No.: US 8,151,158 B2
(45) Date of Patent: Apr. 3, 2012

(54) METHOD AND SYSTEM FOR DECODING A DATA BURST IN A COMMUNICATION SYSTEM

(75) Inventors: Sriram Mudulodu, Santa Clara, CA (US); Louay Jalloul, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 1101 days.

(21) Appl. No.: 11/893,288

(22) Filed: Aug. 15, 2007

(65) Prior Publication Data

US 2009/0049362 A1 Feb. 19, 2009

(51) Int. Cl.
*H03M 13/00* (2006.01)
*H04L 1/18* (2006.01)

(52) U.S. Cl. ............ 714/751; 714/748; 714/749; 455/7

(58) Field of Classification Search ............... 714/748, 714/749, 751; 455/7
See application file for complete search history.

(56) References Cited

U.S. PATENT DOCUMENTS

| | | | | |
|---|---|---|---|---|
| 2002/0150040 A1* | 10/2002 | Tong et al. | ............ | 370/216 |
| 2006/0156163 A1* | 7/2006 | Berens et al. | ............ | 714/748 |
| 2008/0151831 A1* | 6/2008 | Khan et al. | ............ | 370/330 |
| 2008/0209298 A1* | 8/2008 | Chae et al. | ............ | 714/748 |
| 2008/0215948 A1* | 9/2008 | Pinheiro et al. | ............ | 714/748 |

OTHER PUBLICATIONS

Yamamoto, Hirosuke, "Viterbi Decoding Algorithm for Convolutional Codes With Repeat Request", IEEE Transactions on Information Theory, vol. 1T-26, No. 5, Sep. 1980.
Chase, David, "Code Combining A Maximum Likelihood Decoding Approach for Combining an Arbitrary Number of Noisy Packets", IEEE Transactions on Communications Technology, vol. COM-33, No. 5, May 1985.

* cited by examiner

*Primary Examiner* — Sam Rizk
(74) *Attorney, Agent, or Firm* — Sterne, Kessler, Goldstein & Fox P.L.L.C.

(57) ABSTRACT

The present invention provides methods and systems for decoding a data burst in a communication system. A data burst, including a plurality of forward error correction (FEC) blocks, is received. At least one FEC block of the data burst is decoded. Thereafter, it is detected if one or more errors are present in the at least one FEC block of the data burst. Upon detecting one or more errors in the at least one FEC block, the method halts the decoding of the data burst. In response to detecting the one or more errors, a retransmitted data burst corresponding to the data burst is received. One or more FEC blocks of the data burst may be combined with corresponding one or more FEC blocks of the retransmitted data burst. The one or more FEC blocks of the data burst includes the at least one FEC block that had the one or more errors detected as present. Thereafter, the decoding of the retransmitted data burst is commenced starting from the at least one FEC block that had the one or more errors detected as present in the previous transmission.

21 Claims, 3 Drawing Sheets

METHOD AND SYSTEM FOR DECODING A DATA BURST IN A COMMUNICATION SYSTEM

BACKGROUND

The present invention relates to communication systems. More particularly, the present invention relates to a method and system for decoding a data burst in a communication system.

In communication systems, data is typically transmitted between a transmitter and a receiver in the form of data bursts. These data bursts may suffer transmission errors due to various factors such as noise, interference, channel fading, etc. To minimize the effect of the transmission errors, error control techniques such as Forward Error Correction (FEC) and Automatic Repeat reQuest (ARQ) are used. Specifically, each data burst may include a plurality of data blocks. These plurality of data blocks are individually encoded using FEC to obtain FEC blocks. FEC can include, but is not limited to, a block code (BC), a convolution turbo code (CTC), a convolution code (CC) or a low density parity code (LDPC).

In conventional communication systems, physical (PHY) layer of the receiver, on receiving a data burst, stores the data burst in a buffer. An FEC decoder in the PHY layer decodes each FEC block of the data burst. Thereafter, a Media Access Control (MAC) layer of the receiver performs an error check on the decoded FEC blocks. One of the examples of the error check may include, but is not limited to, Cyclic Redundancy Check (CRC). If the MAC layer determines that all the FEC blocks in the data burst are error free, then the receiver transmits an acknowledgement (ACK) or a positive-acknowledgement to the transmitter for the data burst.

Conversely, if the MAC layer determines that any decoded FEC blocks contain one or more erroneous data bits, the receiver transmits a negative acknowledgement (NACK) or a retransmission request to the transmitter. The transmitter then retransmits the data burst received in error to the receiver. The decoding process is applied again to the retransmitted data burst. The retransmission of the data burst continue either till an ACK is not received from the receiver or at least for a predetermined number of retransmissions, whichever is earlier.

This causes undue power consumption even when the data burst is not decoded correctly. For instance, the FEC decoder may decode all the FEC blocks of the data burst even if it is later determined that one or more FEC blocks are faulty. The decoding process involves a high number of computationally intensive operations and also consumes high power. Moreover, for each retransmitted data burst, the decoder decodes all the FEC blocks in the retransmitted data burst, including the successfully decoded FEC blocks of the previous transmission. This may lead to more processing time, higher power consumption and lesser throughput at the receiver end.

There is therefore a need for methods and systems for decoding a data burst in a communication system which reduces power consumption and decreases processing time.

SUMMARY

An embodiment provides a method and system for decoding a data burst in a communication system.

The method and system of an embodiment support reduction in power consumption at a receiver in a communication system. The method and system further support reduction in processing time and an increasing in throughput at a receiver in a communication system.

Embodiments described below include a method and system for decoding a data burst in a communication system. The method includes receiving a data burst. The data burst includes a plurality of forward error correction (FEC) blocks. One or more FEC blocks of the data burst are decoded. The method further includes detecting if one or more errors are present in one or more FEC blocks of the data burst. Upon detecting the one or more errors in one or more FEC blocks, the method halts the decoding of the data burst.

In response to halting the decoding, a retransmitted data burst corresponding to the data burst is received. Thereafter, decoding of the retransmitted data burst is commenced with one or more FEC blocks that were detected in error. In an embodiment, before commencing the decoding of the retransmitted data burst, the method combines one or more FEC blocks of the data burst and corresponding one or more FEC blocks of the retransmitted data burst. The one or more FEC blocks of the data burst include the one or more FEC blocks that were detected in error.

BRIEF DESCRIPTION OF DRAWINGS

A more complete appreciation of the present invention is provided by reference to the following detailed description when considered in conjunction with the accompanying drawings in which reference symbols indicate the same or similar components, wherein.

Figure 1:
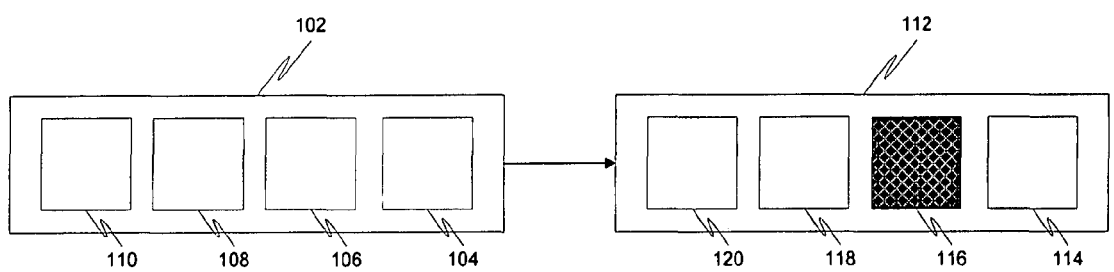
FIG. 1 illustrates an exemplary representation of burst transmission in a communication system in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Before describing in detail embodiments that are in accordance with the present invention, it should be observed that the embodiments reside primarily in combinations of method steps and apparatus components related to methods and systems for decoding a data burst in a communication system. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the present invention described herein may be comprised of one or more conventional transaction-clients and unique stored program instructions that control the one or more transaction-clients to implement, in conjunction with certain non-transaction-client circuits, some, most, or all of the functions of a method for decoding a data burst in a communication system. The non-transaction-client circuits may include, but are not limited to, a radio receiver, a radio transmitter, signal drivers, clock circuits, power source circuits, and user input devices. As such, these functions may be interpreted as steps of methods for decoding a data burst in a communication system. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Generally speaking, pursuant to various embodiments, the present invention provides methods and systems for decoding a data burst in a communication system. A transmitter, such as a base station, in the communication system communicates with a receiver, such as a mobile station, using data bursts. Each data burst includes a plurality of FEC blocks. The present invention provides a method of decoding a data burst at the receiver, such that power consumption is reduced and processing time is decreased.

Referring now to the figures, and specifically to FIG. 1, an exemplary representation of a data burst transmission in a communication system is shown in accordance with an embodiment of the present invention. A transmitter in the communication system sends data to a receiver in form of data bursts. One such data burst to be transmitted to the receiver is depicted as a data burst 102 in FIG. 1. Data burst 102 can be encoded at the transmitter using FEC codes. FEC codes may include, but are not limited to, a block code (BC), a convolution turbo code (CTC), a convolution code (CC) or a low density parity code (LDPC). Data burst 102 can include a plurality of FEC blocks, such as an FEC block 104, an FEC block 106, an FEC block 108 and an FEC block 110.

As shown in FIG. 1, data burst 102 is received as a data burst 112 at the receiver. Data burst 112 includes an FEC block 114 corresponding to FEC block 104, an FEC block 116 corresponding to FEC block 106, an FEC block 118 corresponding to FEC block 108 and an FEC block 120 corresponding to FEC block 110. During transmission, various factors such as noise, interference, channel fading etc. can cause transmission errors in data burst 102. Consequently, one or more FEC blocks of data burst 102 may be received in error at the receiver. For instance, FEC block 106 of data burst 102 may be received with one or more errors at the receiver. Thus, FEC block 106 may be received with one or more errors as FEC block 116 at the receiver.

The receiver can detect the one or more errors in FEC block 116 or in a fraction of one or more FEC blocks of data burst 112 before decoding the entire data burst 112. In accordance with an embodiment, the receiver can halt the decoding of the rest of data burst 112, upon detecting the one or more errors. For instance, the receiver can halt decoding of FEC block 118 and FEC block 120, upon detecting one or more errors in FEC block 116.

Upon detecting one or more errors in data burst 112, the receiver can send either a Negative acknowledgement (NACK) or a retransmission request for data burst 112. In response to receiving one or more of the NACK and the retransmission request, the transmitter retransmits data burst 102 to the receiver. Alternatively, if an acknowledgement for data burst 102 is not received by the transmitter for a predetermined time interval, then the transmitter can automatically retransmit data burst 102 to the receiver.

In an embodiment, the receiver, upon receiving the retransmitted data burst corresponding to data burst 102, decodes only those FEC blocks that were not decoded from data burst 112. Thus, the receiver may not decode FEC block of the retransmitted data burst that corresponds to FEC block 114. The receiver, however, decodes FEC blocks of the retransmitted data burst that correspond to FEC block 116, FEC block 118 and FEC block 120.

Those skilled in the art will realize that, halting decoding of a data burst as soon as one or more errors are detected and decoding only the FEC blocks not decoded in the earlier transmission, can enable reduction in power consumption and decrease in the processing time.

Figure 2:
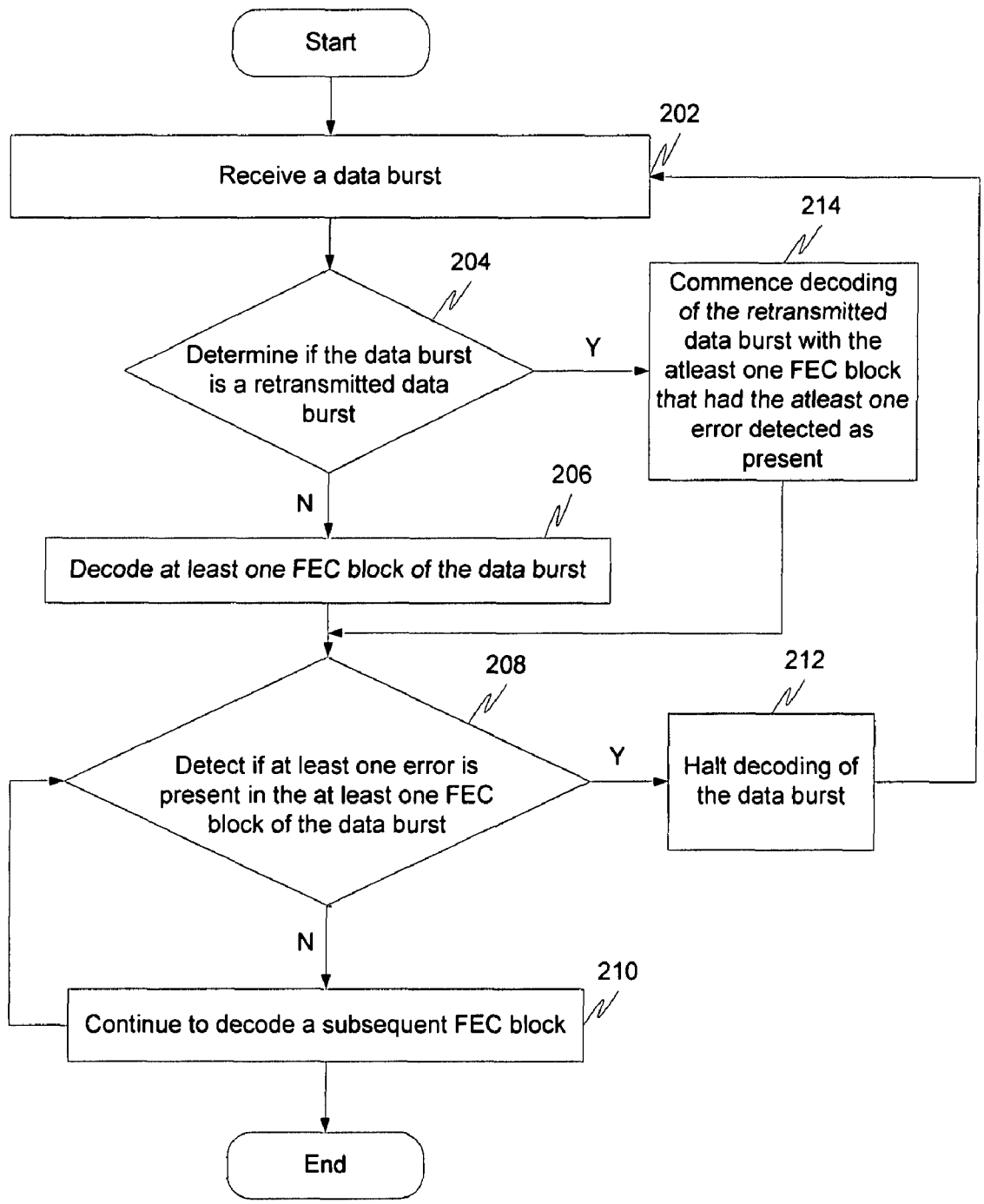
FIG. 2 illustrates a flow diagram for decoding a data burst in a communication system in accordance with an embodiment of the present invention.

Turning now to FIG. 2, a flow diagram for decoding a data burst in a communication system is shown in accordance with an embodiment of the present invention. At 202, a data burst is received by the receiver. For exemplary purposes, the data burst received at the receiver may be considered to be data burst 112 of FIG. 1.

Upon receiving data burst 112, the receiver can buffer data burst 112 for decoding purposes. At 204, it is determined if data burst 112 is a retransmitted data burst. That is, it is determined if the receiver received data burst 112 earlier. The methods of determining if a data burst is a retransmitted data burst are known in the art and all such methods are within the scope of the present invention. If, at 204, it is determined that data burst 112 is not a retransmitted data burst, then one or more FEC blocks of data burst 112 are decoded at 206.

The one or more FEC blocks of data burst 112 may be sequentially decoded in the order in which they are received. For instance, if FEC block 114 is received first and FEC block 120 is received last, then FEC block 114 is decoded first at step 206.

Further, at 208, it is detected if one or more errors are present in FEC block 114 of data burst 112. Those skilled in the art will appreciate that the receiver may detect an error either in an FEC block or in a fraction of the plurality of FEC blocks of data burst 112. For instance, in one embodiment, detecting the one or more errors at 208 includes determining an output metric of an FEC decoder at the receiver. In this embodiment, the unit of data in which the one or more errors can be detected is an FEC block. Hence, the one or more errors can be detected to be present in one or more bits of an FEC block. In this embodiment, the one or more errors are detected in a Physical (PHY) layer of the receiver.

Specifically, in this embodiment, determining the output metric may include determining a quality of a decoder output. The quality of the decoder output may be determined based on a type of code used to form the plurality of FEC blocks of data burst 112.

For instance, if the plurality of FEC blocks of data burst 112 are formed using a convolution code (CC), then determining the output metric may include determining the quality of a viterbi decoder output of a Viterbi decoder at the receiver. Those skilled in the art will appreciate that a Viterbi decoder is used to decode an FEC block that includes CC. However, any other decoder that is capable of decoding an FEC block that includes CC may be used, and is within the scope of the present invention. The quality of the viterbi decoder output may be determined based on a ratio of two or more accumulated path metrics. The two or more accumulated path metrics here may be best accumulated path metric and second best accumulated path metric. FEC block 114 is detected to include one or more errors if this ratio is approximately a predetermined value. The predetermined value here may be unity. On the other hand, if the ratio is very large, then FEC block 114 may be declared good.

Further, if the plurality of FEC blocks of data burst 112 include a CTC, then determining the output metric may include determining a quality of a CTC decoder output of a CTC decoder before a first predetermined number of iterations are exhausted. The first predetermined number of iterations can be a system parameter. Further, the quality of the CTC decoder output may be a convergence quality of the CTC decoder. Those skilled in the art will realize that the convergence quality may be determined based on the number of sign changes of a plurality of bits in the CTC decoder output between the last two iterations performed by the CTC decoder.

Similarly, if the plurality of FEC blocks of data burst 112 are formed using a LDPC, then determining the output metric may include determining a quality of a LDPC decoder output of a LDPC decoder before a second predetermined number of iterations are exhausted. The second predetermined number of iterations can be a system parameter. Further, the quality of the LDPC decoder output may be a convergence quality of the LDPC decoder. Those skilled in the art will realize that the convergence quality may be determined based on the number of sign changes of a plurality of bits in the LDPC decoder output between the last two iterations performed by the LDPC decoder.

It will be appreciated by those skilled in the art that the receiver may include one or more of the CTC decoder, the LDPC decoder and the Viterbi decoder, based on the type of codes used to form the plurality of FEC blocks. Alternately, the receiver may include suitable substitute decoders instead of the CTC decoder, the LDPC decoder and the Viterbi decoder.

In another embodiment, data burst 112 may include bits for Cyclic Redundancy Check (CRC). In this embodiment, upon decoding FEC block 114 at 206, a CRC is performed to detect if FEC block 114 includes the one or more errors. In CRC, the one or more errors can be detected in a unit of data, known in the art as a Packet Data Unit (PDU). A PDU can include data bits in a fraction of the plurality of FEC blocks. Hence, the one or more errors can be detected to be present in one or more bits of a PDU. In this embodiment, the one or more errors are detected in a MAC layer of the receiver. Specifically, a CRC is performed on a PDU comprising one or more data bits of FEC block 114 at 208 to detect if one or more errors are present.

In case the CRC is not included in the FEC block the receiver determines if the FEC block is in error by determining a convergence quality of a CTC or LDPC decoder output after the decoder reaches a predetermined number of iterations. The convergence quality of the decoder can be determined by the number of sign changes of a plurality of bits in the decoder output between last two iterations.

In another embodiment, the receiver can determine if the FEC block is in error by observing the log-likelihood ratio (LLR) variation pattern of some or all bits in the FEC block. If the increase in the sum of the absolute values of the LLRs of all bits across a predetermined number of iterations does not exceed a threshold T, the FEC block may be declared in error.

However, since in accordance with FIG. 1, the FEC block 114 is received without errors, it is detected at 208 that FEC block 114 does not include the one or more errors. Consequently, a subsequent FEC block, FEC block 116, of data burst 112 is decoded at 210.

At 208, it is detected if one or more errors are present in FEC block 116. FEC block 116 may be detected for one or more errors by determining the output metric or by performing the CRC, as described above.

In accordance with FIG. 1, FEC block 116 is received at the receiver with one or more errors. Consequently, FEC block 116 is detected to include one or more errors at 208. At 212, the decoding of data burst 112 is halted, in response to detecting the one or more errors in FEC block 116.

Thereby, the decoding of data burst 112 is stopped as soon as FEC block 116 is detected to include one or more errors. This ensures that the FEC blocks subsequent to FEC block 114 are not decoded as data burst 112 needs to be retransmitted and decoded again. For instance, FEC block 118 and FEC block 120 may not be decoded upon detecting an error in FEC block 116.

Those skilled in the art will realize that halting the decoding of FEC block 118 and FEC block 120 saves power and decreases time for processing data burst 112. Additionally, the receiver achieves higher throughput in terms of decoding more number of data bursts in a unit time.

Further, in an embodiment, one or more errors in a data burst are detected based on CRC on a PDU of the data burst in the MAC layer of the receiver. In this embodiment, an FEC block is initially decoded in the PHY layer and the decoded bits are sent to the MAC layer for applying CRC. Consequently, based on the CRC, if an error is detected in a PDU, the decoding of subsequent FEC blocks is halted in the PHY layer.

In another embodiment, detecting one or more errors in a data burst includes determining an output metric of the data burst in the PHY layer of the receiver. In this embodiment, an FEC block is decoded to obtain a plurality of decoded bits. The plurality of decoded bits is detected for one or more errors by determining the output metric. The detection of one or more errors by determining the output metric is described in detail above. In this embodiment, the one or more errors in the plurality of decoded bits are detected immediately after decoding the FEC block. Further, upon detecting the one or more errors in the FEC block, these decoded bits may not be sent to the MAC layer as done in the previous embodiment. This may lead to further decrease in power consumption and processing time.

Those skilled in the art will realize that detecting the one or more errors by determining the output metric requires lesser power consumption and processing time as compared to detecting the one or more errors using CRC. This is due to early termination of decoding of data burst by detecting errors directly after decoding in the PHY layer itself, as opposed to sending the decoded bits to MAC layer and then applying CRC.

Referring back to FIG. 2, in response to detecting the one or more errors in FEC block 116 at 208, a NACK or a retransmission request corresponding to data burst 112 may be sent to the transmitter. Upon receiving the NACK or the retransmission request corresponding to data burst 102, the transmitter may send a retransmitted data burst corresponding to data burst 102. In an embodiment, if the transmitter does not receive an acknowledgment for data burst 102 from the receiver for a predetermined time, the transmitter may automatically retransmit data burst 102.

In an embodiment, before commencing the decoding of the retransmitted data burst, one or more FEC blocks of the retransmitted data burst may be combined with corresponding one or more FEC blocks of data burst 112. The one or more FEC blocks may include the FEC block that had the one or more errors detected as present in it, as well as FEC blocks subsequent to it. For instance, the one or more FEC blocks may include FEC block 116 that had the one or more errors detected as present, as well as FEC block 118 and FEC block 120.

The one or more FEC blocks may be combined based on known methods such as, but not limited to, a Chase combining method and an incremental redundancy method. Consequently, FEC block 116, FEC block 118 and FEC block 120 may be combined with one or more corresponding FEC blocks of the retransmitted data burst. Thereafter, the retransmitted data burst may be decoded starting with FEC block corresponding to FEC block 116.

In another embodiment, the one or more FEC blocks of the data burst may include each of the plurality of FEC blocks of data burst 112. Hence, each of the plurality of FEC blocks of the retransmitted data burst may be combined with the plurality of FEC blocks of data burst 112.

In an embodiment, the one or more FEC blocks of the retransmitted data burst may be combined with one or more corresponding FEC blocks of any of the previous transmissions of the retransmitted data burst.

Further, in response to commencing the decoding of the retransmitted data burst starting from the FEC block corresponding to FEC block 116, it is detected at 210 if one or more errors are present in the retransmitted data burst. Hence, at 210 it is detected if one or more errors are present in the FEC blocks of the retransmitted data burst corresponding to FEC block 116, FEC block 118 and FEC block 120. The method of detecting the one or more errors is explained in detail above.

If one or more errors are detected in the FEC block of the retransmitted data burst corresponding to FEC block 116, the decoding of the retransmitted data burst is halted at 212. Conversely, if the one or more errors are not detected in the FEC block of the retransmitted data burst corresponding to FEC block 116, then the FEC block of the retransmitted data burst corresponding to FEC block 118 is detected for one or more errors at 208.

This process continues till a data burst is decoded without any errors, or with a permitted number of errors. Those skilled in the art will realize that, halting decoding of a data burst as soon as one or more errors are detected and decoding only those FEC blocks not decoded in the earlier transmission, can enable reduction in power consumption and decrease in the processing time.

Figure 3:
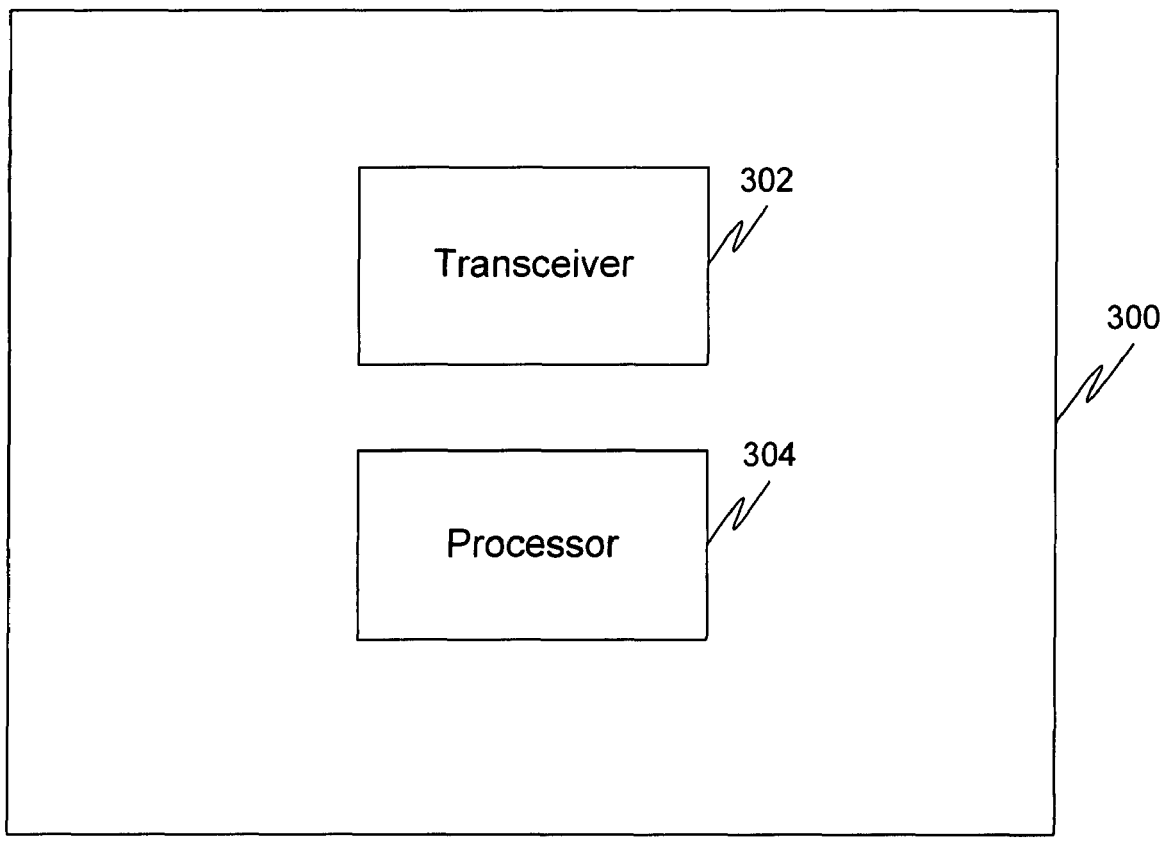
FIG. 3 is a block diagram showing a system for decoding a data burst in a communication system, in accordance with an embodiment of the present invention.

Referring now to FIG. 3, a block diagram of a system 300 for decoding a data burst in a communication system is shown in accordance with an embodiment of the present invention. System 300 includes a transceiver 302 and a processor 304, operatively coupled to transceiver 302. System 300 may be coupled to a receiver in the communication system. The receiver may be, but is not limited to, a mobile phone, a personal digital assistant, a personal computer, a laptop or a paging device.

In the communication system, data is transmitted to the receiver in the form of data bursts. Transceiver 302 is configured to receive a data burst. The data burst may include a plurality of FEC blocks. For exemplary purposes, the data burst received by transceiver 302 may be considered to be data burst 112 of FIG. 1.

In response to transceiver 302 receiving data burst 112, processor 304 determines if data burst 112 is a retransmitted data burst or is received for the first time. The methods of determining if a data burst is a retransmitted data burst are known in the art, and all such methods are within the scope of the present invention. If processor 304 determines that data burst 112 is not a retransmitted data burst, then processor 304 decodes one or more FEC blocks of data burst 112.

Processor 304 may decode the one or more FEC blocks of data burst 112 sequentially in the order in which they are received. For instance, processor 304 may decode FEC block 114 first, followed by FEC block 116 and so on, as FEC block 114 is received first and FEC block 120 is received last by transceiver 302.

Thereafter, processor 304 detects if one or more errors are present in FEC block 114. Processor 304 may detect the one or more errors either in an FEC block or in a fraction of the plurality of FEC blocks of data burst 112, based on whether the one or more errors are detected by determining an output metric obtained from decoding an FEC block or by using a CRC.

In an embodiment, processor 304 may detect the one or more errors by determining the output metric obtained from decoding FEC block 114. In this embodiment, the unit of data in which the one or more errors can be detected is an FEC block. Hence, processor 304 detects one or more errors to be present in one or more bits of FEC block 114.

Specifically, in this embodiment, the output metric may be determined by determining a quality of a decoder output. The quality of the decoder output may be determined based on a type of code used to form the plurality of FEC blocks of data burst 112.

For instance, if the plurality of FEC blocks of data burst 112 includes a CC, then processor 304 may decode FEC block 114 using a viterbi decoding process. Those skilled in the art will appreciate that the Viterbi decoding process is used to decode an FEC block formed using CC. However, any other decoding process for decoding an FEC block formed using CC may be used, and is within the scope of the present invention. Processor 304 may determine the output metric by determining a quality of a viterbi decoder output of the viterbi decoding process. The quality of the viterbi decoder output may be determined based on a ratio of two or more accumulated path metrics. The two or more path metrics may be best accumulated path metric and second best accumulated path metric. Processor 304 detects FEC block 114 to include one or more errors if this ratio is approximately a predetermined value. The predetermined value may be unity. On the other hand, processor 304 may determine FEC block 114 to be good, if this ratio is very large.

Further, if the plurality of FEC blocks of data burst 112 includes a CTC, then processor 304 may decode FEC block 114 using a CTC decoding process. Processor 304 may determine the output metric by determining a quality of a CTC decoder output of the CTC decoding process before a first predetermined number of iterations are exhausted. The first predetermined number of iterations can be a system parameter. Further, the quality of the decoder output may include a convergence quality. Those skilled in the art will realize that the convergence quality may be determined by processor 304 based on the number of sign changes of a plurality of bits in the decoder output between the last two iterations performed by processor 304.

Furthermore, if the plurality of FEC blocks of data burst 112 include a LDPC, then processor 304 may decode FEC block 114 using a LDPC decoding process. Processor 304 may determine the output metric by determining a quality of a LDPC decoder output of the LDPC decoding process before a second predetermined number of iterations are exhausted. The second predetermined number of iterations can be a system parameter. Further, the quality of the decoder output may include a convergence quality. Those skilled in the art will realize that the convergence quality may be determined by processor 304 based on the number of sign changes of a plurality of bits in the decoder output between the last two iterations performed by processor 304.

In another embodiment, data burst 112 may include bits for CRC. In this embodiment, upon decoding FEC block 114, processor 304 may perform CRC to detect if FEC block 114 includes the one or more errors. In CRC, processor 304 may detect one or more errors in a unit of data, known in the art as Packet data unit (PDU). A PDU can include data bits in a fraction of the plurality of FEC blocks. Hence, processor 304 may detect the one or more errors to be present in one or more bits of a PDU, instead of an FEC block. Specifically, processor 304 may perform a CRC on a PDU comprising one or more data bits of FEC block 114 to detect if one or more errors are present.

However, since in accordance with FIG. 1, FEC block 114 is received without any errors, processor 304 determines that FEC block 114 does not include the one or more errors. Consequently, processor 304 decodes a subsequent FEC block, FEC block 116, of data burst 112.

Thereafter, processor 304 detects if one or more errors are present in FEC block 116. FEC block 116 may be detected for one or more errors by determining the output metric or performing the CRC, as described above. Consequently, processor 304 detects FEC block 116 to include one or more errors. Processor 304 halts the decoding of data burst 112, in response to detecting the one or more errors in FEC block 116.

Hence, processor 304 halts the decoding of data burst 112 as soon as FEC block 116 is detected to include one or more errors. This ensures that the FEC blocks, subsequent to FEC block 114, are not decoded by processor 304, as data burst 112 needs to be retransmitted and decoded again. For instance, processor 304 does not decode FEC block 118 and FEC block 120 upon detecting an error is FEC block 116.

In response to detecting the one or more errors in FEC block 116, transceiver 302 may send a NACK or a retransmission request corresponding to data burst 112 to the transmitter. Upon receiving the NACK or the retransmission request corresponding to data burst 102, the transmitter may send a retransmitted data burst corresponding to data burst 102. In an embodiment, if the transmitter does not receive an acknowledgment for data burst 102 from the receiver for a predetermined time, the transmitter may automatically retransmit data burst 102.

Transceiver 302 may then receive the retransmitted data burst corresponding to data burst 112. Those skilled in the art will realize that processor 304 may be configured to determine if a received data burst is received for the first time or is a retransmitted data burst. If processor 304 determines that the received data burst is a retransmitted data burst, processor 304 commences decoding of the retransmitted data burst, starting from an FEC block that had the one or more errors detected as present in the previous transmission.

In an embodiment, before commencing the decoding of the retransmitted data burst, processor 304 may combine one or more FEC blocks of the retransmitted data burst with corresponding one or more FEC blocks of data burst 112. The one or more FEC blocks may include the FEC block that had the one or more errors detected as present in it, as well as FEC blocks subsequent to it. For instance, the one or more FEC blocks may include FEC block 116 that had the one or more errors detected as present in it, as well as FEC block 118 and FEC block 120.

Processor 304 may combine the one or more FEC blocks based on known methods such as, but not limited to, a chase combining method and an incremental redundancy method. Consequently, processor 304 may combine FEC block 116, FEC block 118 and FEC block 120 with one or more corresponding FEC blocks of the retransmitted data burst. Thereafter, processor 304 may decode the retransmitted data burst starting with FEC block corresponding to FEC block 116.

In another embodiment, the one or more FEC blocks of the data burst may include each of the plurality of FEC blocks of data burst 112. Hence, processor 304 may combine each of the plurality of FEC blocks of the retransmitted data burst with the plurality of FEC blocks of data burst 112.

In an embodiment, processor 304 may combine one or more FEC blocks of the retransmitted data burst with one or more corresponding FEC blocks of any of the previous transmissions of the retransmitted data burst.

Processor 304, upon decoding an FEC block of the retransmitted data burst corresponding to FEC block 116, and may detect if one or more errors are present in the FEC block. The method of detecting the one or more errors is explained in detail above.

If processor 304 detects one or more errors in the FEC block of the retransmitted data burst corresponding to FEC block 116, then processor 304 halts decoding of the retransmitted data burst. Conversely, if processor 304 does not detect the one or more errors in the FEC block of the retransmitted data burst corresponding to FEC block 116, then processor 304 detects if one or more errors are present in the FEC block of the retransmitted data burst corresponding to FEC block 118.

System 300 continues the above process till a data burst is decoded without any errors or with a permitted number of errors. Those skilled in the art will realize that, halting decoding of a data burst as soon as one or more errors are detected and decoding only those FEC blocks not decoded in the earlier transmission, can enable reduction in power consumption and decrease in the processing time.

Those skilled in the art will realize that transceiver 302 and processor 304 can be coupled or connected in any of a variety of combinations as appropriate to a device that includes system 300.

Various embodiments of the present invention provide methods and systems for decoding a data burst in a communication system. Further, the various embodiments of the present invention provide methods and systems for reduction of power consumption in a receiver in a communication system. In addition, the various embodiments of the present invention provide methods and systems for reducing processing time and for increasing throughput in a receiver in a communication system.

Those skilled in the art will realize that the above recognized advantages and other advantages described herein are merely exemplary and are not meant to be a complete rendering of all of the advantages of the various embodiments of the present invention.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage, or solution to occur or become more pronounced are not to be construed as a critical, required, or essential features or elements of any or all the claims. The present invention is defined solely by the appended claims including any amendments made during the pendency of this application and all equivalents of those claims as issued.

What is claimed is:

1. A method of decoding a data burst, the data burst comprising a plurality of forward error correction (FEC) blocks, the method comprising:
   receiving, at a receiver, the data burst;
   decoding, at a processor, at least one FEC block of the data burst, the at least one FEC block being included in the plurality of FEC blocks;
   detecting, at the processor, whether at least one error is present in the at least one FEC block of the data burst;
   halting, at the processor, decoding of the data burst when at least one error is detected to be present in the at least one FEC block of the data burst;
   receiving, at the receiver, a retransmission of the data burst as a retransmitted data burst in response to the halting decoding of the data burst; and
   commencing decoding of a combined data burst with an FEC block corresponding to the at least one FEC block in which the at least one error was detected to be present, wherein one or more FEC blocks of the data burst and corresponding one or more FEC blocks of the retransmitted data burst are combined to generate the combined data burst, the one or more FEC blocks of the data burst comprising the at least one FEC block in which the at least one error was detected to be present.

2. The method of claim 1, further comprising:
   forming an FEC block in the data burst, comprising at least one of a block code (BC), a convolution code (CC), a convolution turbo code (CTC) and a low density parity code (LDPC).

3. The method of claim 1, wherein the method further comprises:
   sending at least one of a negative-acknowledgement and a retransmission request corresponding to the data burst when the at least one error is detected to be present in the at least one FEC block; and
   sending an acknowledgement corresponding to the data burst when the at least one error is detected to be absent in the decoding of the plurality of FEC blocks of the data burst.

4. The method of claim 1, wherein the one or more FEC blocks of the data burst comprises at least one of the plurality of FEC blocks of the data burst.

5. The method of claim 1 further comprising:
   halting decoding of the combined data burst when at least one error is detected to be present in the combined data burst.

6. The method of claim 1, wherein the one or more FEC blocks of the data burst and the one or more FEC blocks of the retransmitted data burst are combined based on one of a Chase combining method and an incremental redundancy method.

7. The method of claim 1, wherein the detecting the at least one error comprises performing a cyclic redundancy check (CRC) when the CRC is detected to be present in the data burst.

8. The method of claim 7, wherein the detecting at least one error comprises determining an output metric of an FEC decoder when the CRC is detected to be absent in the data burst.

9. The method of claim 8, wherein the determining the output metric comprises determining a quality of a CTC decoder output, wherein a CTC decoder reaches a first predetermined number of iterations when the plurality of FEC blocks are formed using a CTC.

10. The method of claim 9, wherein the determining the quality of the CTC decoder output comprises a convergence quality of the CTC decoder, wherein the convergence quality of the CTC decoder is based on a number of sign changes of a plurality of bits in the CTC decoder output between last two iterations.

11. The method of claim 8, wherein the determining the output metric comprises determining a quality of a LDPC decoder output, a LDPC decoder reaching a second predetermined number of iterations when the plurality of FEC blocks are formed using a LDPC.

12. The method of claim 11, wherein the quality of the LDPC decoder output comprises a convergence quality of the LDPC decoder, the convergence quality of the LDPC decoder being based on a number of sign changes of a plurality of bits in the LDPC decoder output between last two iterations.

13. The method of claim 8, wherein the determining the output metric comprises determining a quality of a Viterbi decoder output when the plurality of FEC blocks are formed using a CC, the quality of a Viterbi decoder output being based on a ratio of at least two accumulated path metrics.

14. The method of claim 7, wherein, when the CRC is detected to be absent in the data burst, the detecting the at least one error comprises observing a log-likelihood ratio (LLR) variation pattern of one or more bits in the at least one FEC block, the at least one error being detected to be present in the at least one FEC block when the log-likelihood ratio (LLR) variation pattern implies that, across a predetermined number of iterations, an increase in a sum of one or more absolute LLRs corresponding to the one or more bits is less than a threshold T.

15. A system for decoding a data burst, the data burst comprising a plurality of forward error correction (FEC) blocks, the system comprising:
   a transceiver, the transceiver configured for:
     receiving the data burst,
   a processor operatively coupled to the transceiver, the processor configured for:
     decoding at least one FEC block of the data burst, the at least one FEC block belonging to the plurality of FEC blocks;
     detecting if at least one error is present in the at least one FEC clock of the data burst;
     halting decoding of the data burst, if at least one error is present in the at least one FEC block of the data burst;
     requesting retransmission of the data burst, in response to halting decoding of the data burst; and
     commencing decoding of a combined data burst with the at least one FEC block that had the at least one error detected as present, wherein one or more FEC blocks of the data burst and corresponding one or more FEC blocks of the retransmitted data burst are combined to generate the combined data burst, the one or more FEC blocks of the data burst comprising the at least one FEC block that had the at least one error detected as present, wherein the retransmitted data burst is received by the transceiver in response to requesting by the processor.

16. The system of claim 15, wherein the transceiver is further configured for:
   sending at least one of a negative-acknowledgement and a retransmission request corresponding to the data burst, if the at least one error is present in the at least one FEC block; and
   sending an acknowledgement corresponding to the data burst, if the at least one error is absent in the decoding of the plurality of FEC blocks of the data burst.

17. The system of claim 15, wherein the processor is further configured for:
   halting decoding of the combined data burst, if at least one error is present in the combined data burst.

18. The system of claim 15, wherein the processor is configured for combining the one or more FEC blocks of the data burst and the corresponding one or more FEC blocks of the retransmitted data burst based on one of a Chase combining method and an incremental redundancy method.

19. The system of claim 15, wherein the processor is configured for a cyclic redundancy check (CRC) for detecting the at least one error in the at least one FEC block, if the CRC is present in the data burst.

20. The system of claim 19, wherein the processor is further configured for determining an output metric for detecting the at least one error in the at least one FEC block, if the CRC is absent in the data burst.

21. The system of claim 20, wherein determining the output metric is based on the at least one FEC block comprising at least one of a block code (BC), a convolution code (CC), a convolution turbo code (CTC) and a low density parity code (LDPC) used to form the plurality of FEC blocks in the data burst.

* * * * *

UNITED STATES PATENT AND TRADEMARK OFFICE
CERTIFICATE OF CORRECTION

PATENT NO. : 8,151,158 B2
APPLICATION NO. : 11/893288
DATED : April 3, 2012
INVENTOR(S) : Mudulodu et al.

It is certified that error appears in the above-identified patent and that said Letters Patent is hereby corrected as shown below:

Title page:
Item (56), References, Other Publications, please replace "vol. 1T-26" with --vol. IT-26--.

IN THE CLAIMS:

Column 12
Line 59, Claim 15, please replace "FEC clock" with --FEC block--.

Signed and Sealed this
Twenty-sixth Day of June, 2012

David J. Kappos
*Director of the United States Patent and Trademark Office*